(12) United States Patent
Niv et al.

(10) Patent No.: US 6,956,365 B2
(45) Date of Patent: Oct. 18, 2005

(54) SYSTEM AND METHOD FOR CALIBRATION OF TESTING EQUIPMENT USING DEVICE PHOTOEMISSION

(75) Inventors: Israel Niv, Palo Alto, CA (US); Steven Kasapi, San Francisco, CA (US)

(73) Assignee: Credence Systems Corporation, Milpitas, CA (US)

(*) Notice: Subject to any disclaimer, the term of this patent is extended or adjusted under 35 U.S.C. 154(b) by 175 days.

(21) Appl. No.: 10/408,988

(22) Filed: Apr. 8, 2003

(65) Prior Publication Data

US 2004/0201375 A1 Oct. 14, 2004

(51) Int. Cl.⁷ .............................................. G01R 35/04
(52) U.S. Cl. .................................................. 324/158.1
(58) Field of Search ............................... 324/158.1, 74, 324/617; 368/107; 702/85; 714/700, 814, 815, 719

(56) References Cited

U.S. PATENT DOCUMENTS 5,764,655 A * 6/1998 Kirihata et al. ............. 714/733
6,826,720 B2 * 11/2004 Suzuki et al. ............... 714/720

* cited by examiner

Primary Examiner—Vinh Nguyen
Assistant Examiner—Trung Q Nguyen
(74) Attorney, Agent, or Firm—Joseph Bach; JBPatents.com

(57) ABSTRACT

A system and method for calibration of a commercial semiconductor test system (tester). The system receives a synchronization signal from the tester and detects light emission from a device under test (DUT). The system then compares the timing and characteristics of the light emission to the synchronization signal to obtain a delay timing and signal change caused by intermediate elements of the tester. The delay timing and signal change are used to calibrate the various channels of the tester. Also described are various designs for DUT's to obtained enhanced accuracy of the delay timing. Further, a system and method are described for reconstruction of a test signal and study of the effects of intermediate elements of the tester on the shape of the test signal.

7 Claims, 4 Drawing Sheets

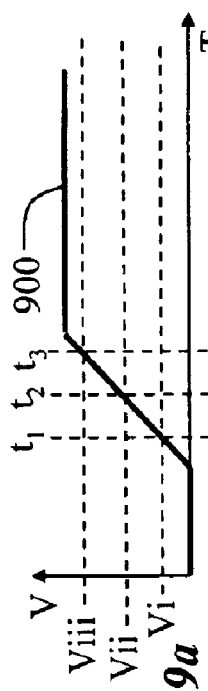
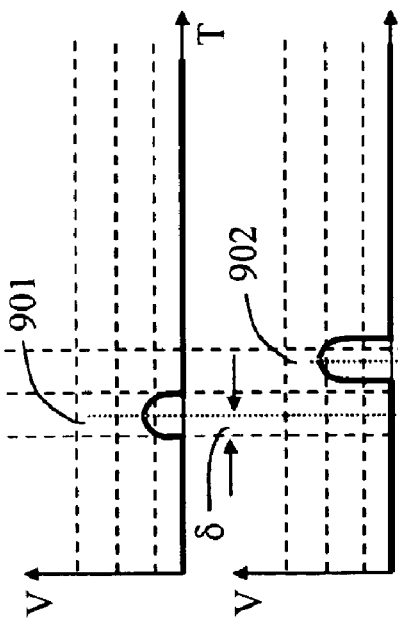
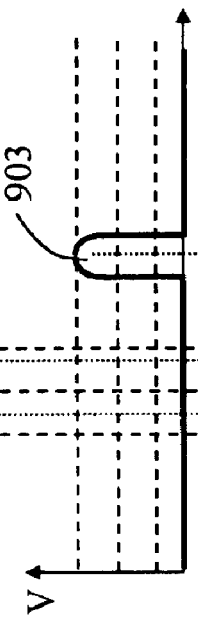
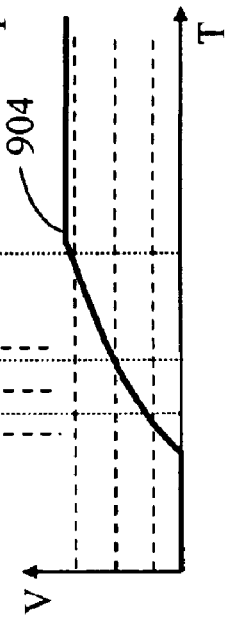
*Figure 9a*  *Figure 9b*  *Figure 9c*  *Figure 9d*  *Figure 9e*
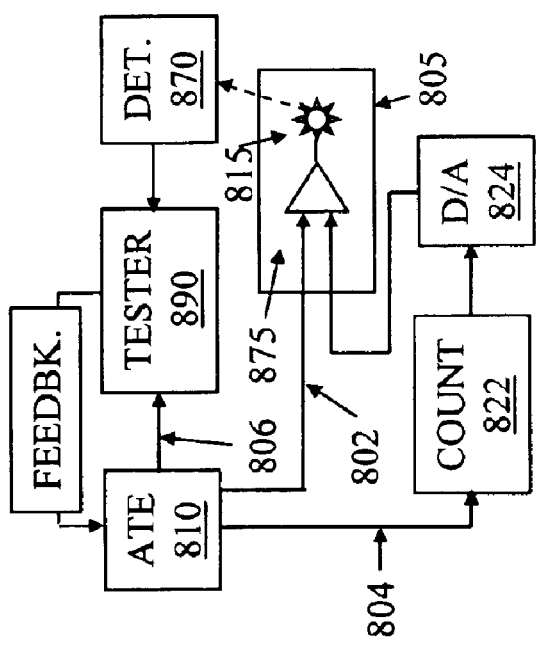
*Figure 8*

SYSTEM AND METHOD FOR CALIBRATION OF TESTING EQUIPMENT USING DEVICE PHOTOEMISSION

BACKGROUND OF THE INVENTION

1. Field of the Invention

The present invention relates to a method and a system for calibration of semiconductor testing equipment ("tester") using photoemission detection of switching devices, especially for calibrating signal timing and characteristics in such devices.

2. Description of the Related Art

Testing Equipment (testers) are well known in the art for measuring performance of, and debugging semiconductor circuits. Examples of such equipments are NPTest 9000 available from NPTest of San Jose, Calif., and Vanguard available from IMS (a Credence Company) of Hillsboro, Oreg. FIG. 1 depicts a general schematic of a tester 100, consisting of a controller (may be a tailor-programed general-purpose computer) 110, a test head 120 having a tester load board adapter 125. For debug of an integrated circuit (IC), the IC is attached to a DUT socket (not shown), which is mounted onto the load board 130. The load board 130 is electrically connected to the test adapter 125 via, e.g., cable interface (not shown). The controller 110 then generates various test signals that are transmitted to the IC via the test adapter 125 and load board 130. The tests comprise switching of the IC's transistors with timing accuracy on the order of hundreds and/or tens of picoseconds, using many signal channels. Accordingly, accurate characterization of signal delay caused by the various tester interface elements, including the tester board, test adapter 125, cable interface, load board 130, and the socket are extremely important. Notably, two values are of particular interest: the absolute delay, i.e., the delay introduced into a single channel, and the relative delay, i.e., the difference between the delays introduced into multiple channels.

Another field of art relating to the invention is the study of semiconductor photoemission. It is known in the art that various mechanisms in semiconductor devices can cause light emission. Detection of such light emission has been used to investigate semiconductor devices. For example, avalanche breakdown in insulators cause light emission, and detection of such light emission can point to the locations of failure in the device. Similar detection can be used to characterize electrostatic discharge in the device. In electrically stimulated (active) transistors, accelerated carriers (electrons & holes), a.k.a. hot-carriers, emit light when the device draws current. Various emission microscopes have been used for detecting locations on the device where the electrical current drawn exceeds the expected levels and therefore could lead to locating failures in semiconductor devices. Some of these hot-carrier emission microscopes have been disclosed in the prior art. See, for example, U.S. Pat. Nos. 4,680,635; 4,811,090; 5,475,316; and 5,940,545; which are incorporated herein in their entirety by reference.

The Emiscope™ is a time-resolved emission (TRE) microscope available from the assignee, Optonics, Inc. (a Credence company), of Mountain View, Calif., and is described in U.S. application Ser. No. 09/995,548, which is incorporated herein in its entirety by reference. The Emiscope™ makes use of the fact that for transistors the photoemission coincides (in-time and characteristics) directly with the voltage transition responsible for the change in the state (logic) of the device. Therefore, it is normally used in conjunction with a tester i.e., the device under test (DUT) is connected to the tester and is being electrically stimulated by it, while the Emiscope™ detects and times emission from the DUT. Using this set-up, one can study the response of the DUT to various electrical stimuli by correlating the Emiscope™ detection signals to the expected signals.

As can be readily understood, timing accuracy of both the tester and the TRE is extremely important. Notably, any time delay introduced by the test adapter, the load board, and other intervening elements must be carefully characterized and accounted for. The present invention provides a method and system for accurate characterization and correction of such delays.

SUMMARY OF THE INVENTION

The present invention provides a method and a system for accurate characterization and correction of delays caused by elements of a tester. The invention also provides a method and system for accurate characterization of the different delays on the different pins of the test boards and on the DUT fixturing. Other characterizations, such as DC voltage; linearity; Output channels; analog channels; etc. are also enabled. The disclosed invention provides at least the following advantages: fast and accurate calibration of timing and voltage level of pins, including calibration of tester load board and socket (while conventional calibration methods require removal of the load board and insertion of a special calibration fixture).

According to one aspect of the invention, a tester is synchronized with a TRE system and stimulates a DUT using multiple channels. The TRE system accurately times emissions from the DUT, and the timing of the multiple channels are compared to each other. When a discrepancy is detected, the appropriate correction is performed on the tester so that the delay caused by intermittent elements is accounted for.

In one aspect of the invention, a TRE system is connected to a tester and receives synchronizing signals therefrom. The TRE system detects and times photoemissions from the DUT, as the tester stimulate the DUT using multiple test data channels. A feedback loop is then provided from the photoemission analyzer to the tester, so that delays caused by intermittent elements can be compensated for and the tester can be adequately calibrated.

According to another aspect of the invention, a DUT's response to stimuli signals is first characterized. The DUT is then designated as a calibration DUT. The calibration DUT is mounted onto a load board and is stimulated by a tester. A TRE system is used to detect photoemission from the DUT and the timing of the detection is used to characterize delay in the signal path of the various cannels of the tester. This information is then used to calibrate the tester.

According to yet another aspect of the invention, a calibration DUT is designed and fabricated to enable simplified detection of delays in the tester's data channels. The calibration DUT may include light paths, multiple emitters and/or multiple gates connected to a single emitter. The calibration DUT is used in conjunction with a photoemission equipment to obtain delay data in transmission lines of a Tester.

According to a further aspect of the invention, a system is provided for characterizing the change in the signal shape resulting from the various intermediate elements of the tester. The system comprises a comparator that enables gating of a photoemitter, so that emission is enabled only when the test signal reaches a pre-determined state, such as, for example, a particular voltage level. To study the change in the test signal's shape, the test signal is sent to the DUT several times. Each time the signal is sent, a photoemitter in the DUT is gated by the comparator to a different level. Consequently, each time the signal is sent, the photoemission corresponds to different "location" of the test signal shape. Using multiple such measurements the modified signal shape can be reconstructed.

BRIEF DESCRIPTION OF THE DRAWINGS

The invention is described herein with reference to particular embodiments thereof, which are exemplified in the drawings. It should be understood, however, that the various embodiments depicted in the drawings are only exemplary and may not limit the invention as defined in the appended claims.

FIG. 8 depicts an embodiment of the inventive system for detection of signal corruption or shape modification.

FIGS. 9a–9e depict examples of signals obtained from the various elements of the system depicted in FIG. 8.

DETAILED DESCRIPTION

Figure 2:
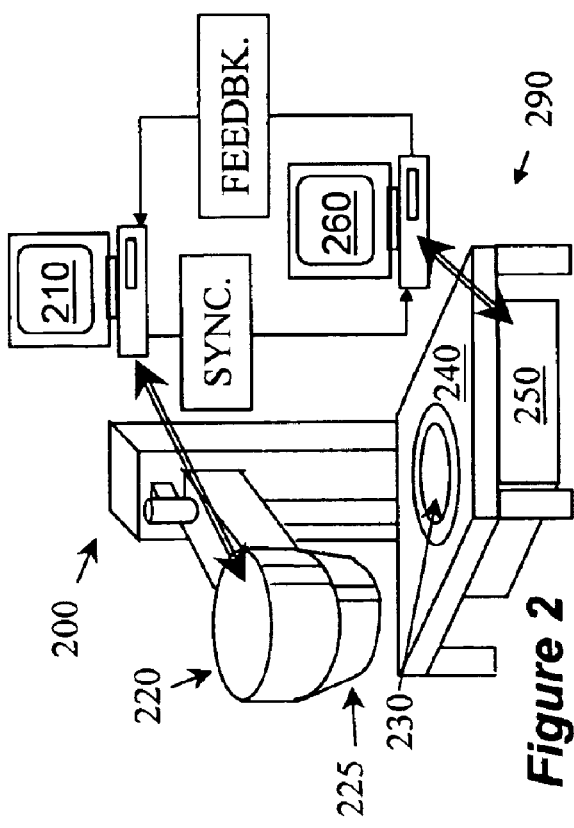
FIG. 2 depicts the major components of an embodiment of the inventive testing and calibration system.
Figure 3:
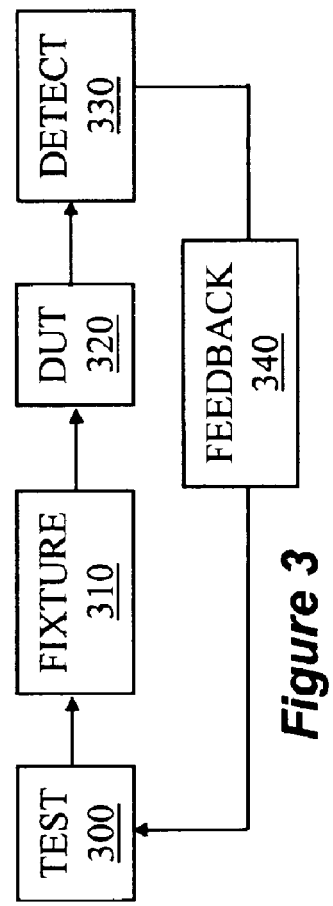
FIG. 3 is a block diagram of an embodiment of the inventive testing and calibration system and method.
Figure 1:
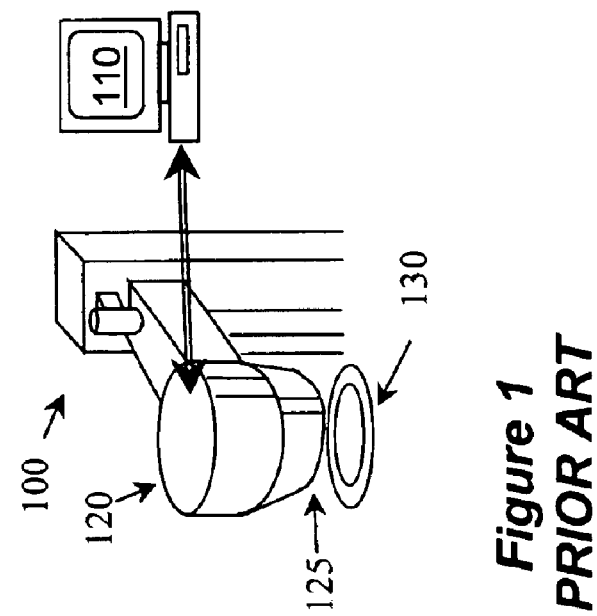
FIG. 1 is a general schematic depicting the major components of a conventional tester.

An illustrative embodiment of the present invention will now be described with reference to FIGS. 2 and 3, which are a general schematic and a block diagram of the inventive calibration system and method, respectively. In FIG. 2, a tester 200 is operable in conjunction with a TRE system 290 such as, e.g., the Emiscope™. The tester comprises, among others, a controller 210, a tester head 220, a DUT adapter 225, and a load board 230. The TRE system 290 comprises, among others, a controller 260 and a detection unit 250, which is mounted onto vibration-isolated bench 240. Both or either of controllers 210 and 260 may be a tailor-programmed general-purpose computer. In performing a typical operation according to the present embodiment, controller 210 emits various test signals that are programmed to stimulate a DUT. The signals are transmitted to the DUT through the various tester intermediate elements, such as the tester head 220, the adapter 225, and the load board 230. This operation is schematically illustrated in FIG. 3 as the arrows from TEST 300, via FIXTURE 310, to DUT 320; FIXTURE 310 being the various intermediate elements of the tester 200. As the DUT receives the stimuli signals, it emits light, which is detected by detection unit 250. This operation is illustrated in FIG. 3 as the arrow from DUT 320 to DETECT 330. Each photon-emission detection event is timed and correlated to a signal output by the tester 200. The timing information is compared for the various transmission channels and a relative delay for the various channels is calculated. This information is fed back to the tester for calibration, which is depicted in FIG. 3 as the FEEDBACK 340 arrow.

Figure 4:
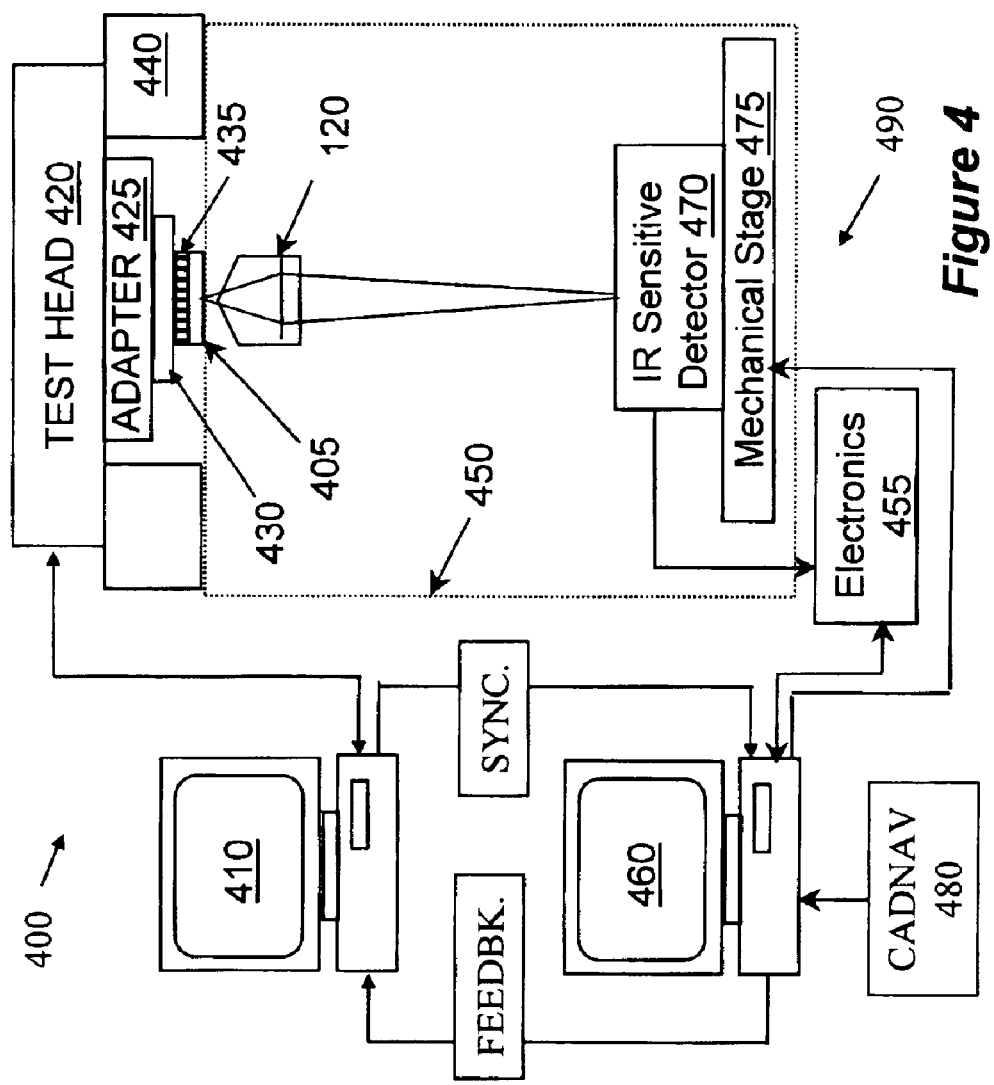
FIG. 4 depicts an embodiment of the inventive system for calibration of a tester.

FIG. 4 depicts an embodiment of the inventive system in more details, although various elements not relevant to understanding of the invention have been omitted. A commercially available tester 400 includes a controller 410, which provides pre-programmed test signals to DUT 405. The DUT 405 is mounted onto a load board 430, which is attached to the test head 420 via adapter 425. The test signals generated by the controller 410 of the tester 400 are provided on multiple channels (generally several hundreds) and are transmitted to the devices inside the DUT 405 by the DUT pins 435. Generally, each of pins 435 corresponds to one channel of the tester 400.

When the signals are received by various devices inside DUT 405, the devices switch states according to the instructions of the signals. Upon each such switching of state, the particular device inside the DUT 405 emits light. The TRE system 490 detects this light and records its detection timing. The TRE system 490 generally comprises collection optics 120, an infrared detector 470, electronics 455 and controller 460. Detector 470 may be, for example, a photomultiplier tube (PMT), a photocathode coupled to a multichannel plate (MCP), an avalanche photodiode (APD), etc. The optics 120 and detector 470 are coupled to stage 475, so that a particularly specified location on DUT 405 may be monitored for emission. The motion of the stage to acquire the specified location is performed by the controller 460 in accordance with the chip design and layout stored in a CAD software, such as, for example, Cadence™, and using navigation software, such as, for example, Merlin's Framework™ available from Knights Technology (www.electroglass.com). Alternatively, the optics may be stationary and the DUT may be coupled to a stage. However, if no navigation is required, both the optics and the DUT may be stationary.

When the controller 410 sends the test signals to the DUT, it also sends synchronization signal SYNC to the controller 460, so that the emission detection can be timed with respect to the timing of the test signal. As noted above, the various intervening elements of the tester introduce delay in the signal, which should be accounted for in order to obtain accurate reading of the light emission, i.e., the temporal response of the DUT devices. Therefore, according to an embodiment of the present invention, the signals from the various channels are compared to each other to obtain relative delay between the channels of the tester. The various delays are fed back to the tester, either by manually calibrating the tester or automatically by a feedback signal FEEDBK. Once the tester has been calibrated, general testing of the DUT 405 may begin.

According to another aspect of the invention, an absolute calibration of delay on each channel is performed. That is, while in the previous embodiment the emission timing delay of each channel is analyzed with respect to the delay of the other channels so as to eliminate time delay variation among the channels, in this embodiment each channel is calibrated with respect to its own emission timing. In one implementation the delay that may be introduced by the DUT 405 is simply ignored. That is, due to the small delay that may be introduced by the micro-scale elements of the DUT relative to the delay introduced by the macro-scale elements of the tester, the entire delay detected is ascribed to the tester elements and each channel of the tester is calibrated individually. On the other hand, according to another embodiment, in order to isolate the delay introduced by the DUT itself, the DUT is first fully characterized so that delays introduced by the various devices and channels are known. This delay is then subtracted from the total delay detected and each channel of the tester is calibrated according to the resulting net delay.

Figure 5B:
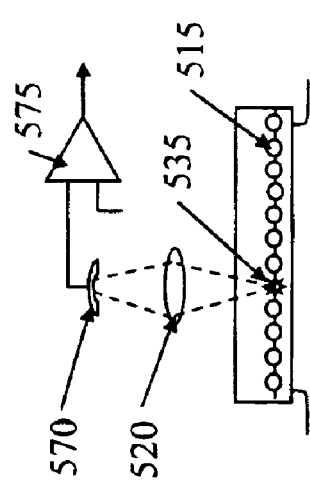
FIGS. 5a and 5b depict an embodiment of a calibration DUT.
Figure 5A:
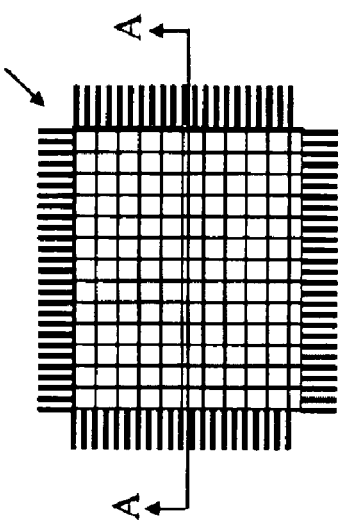

According to yet another embodiment, a specific calibration DUT is constructed and used in the system of the invention to calibrate the tester. One example of a calibration DUT 505 according to the invention is depicted in FIGS. 5*a* and 5*b*; wherein FIG. 5*a* is a top view, while FIG. 5*b* is a cross-section along line A—A. In this embodiment, the calibration DUT 505 generally comprises an array of switching device, e.g., CMOS transistors 515, arranged one per channel. When a signal is provided from a specific channel of the tester, the corresponding device emits light, as depicted by device 535. The light is then collected by the collection optics 520 and detected by detector 570. Relative or absolute delay is then calculated, as shown conceptually by differential amplifier 575. The calibration DUT 505 may be characterized so that the delay introduced by each of the switching devices 515 is known. However, even if the characterization is not performed, it is believed that the delay introduced by the switching devices 515 is much smaller than the delay introduced by the elements of the tester, and that delay accuracy of 10 psec can be achieved.

Figure 6:
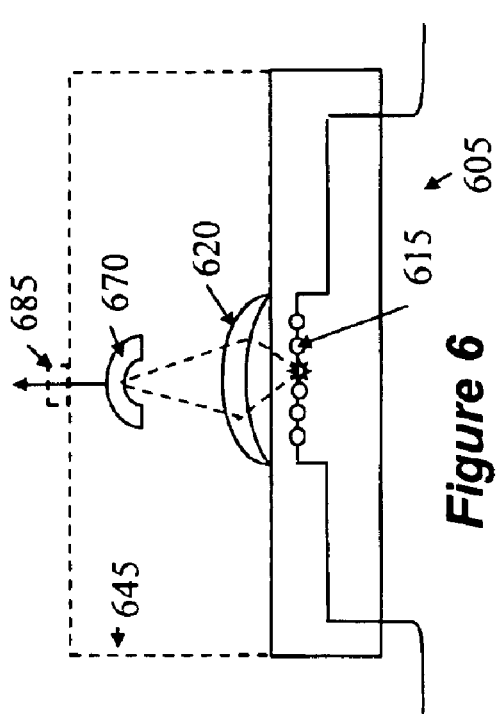
FIG. 6 depicts another embodiment of a calibration DUT.

Another embodiment of a calibration DUT 605 is depicted in FIG. 6. In this embodiment, several switching elements 615 are provided in a central location, so that detection of light emission can be made without large movement of the collection optics 620. The collection optics 620 directs the collected light onto detector 670, which then provides a detection signal to the system, as explained above. According to one embodiment, the collection optics 620 and the detector 670 are encapsulated within the DUT 605, as exemplified by the broken line 645. In such a case, a contact 685 can be provided for collecting the detection signals from the detector 670.

Figure 7:
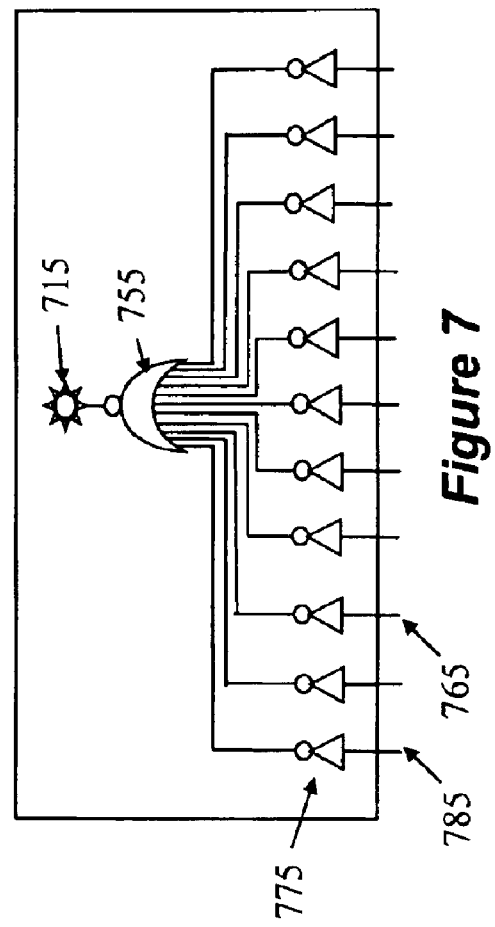
FIG. 7 depicts yet another embodiment of a calibration DUT.

Yet another embodiment of a calibration DUT is depicted in FIG. 7. Notably, in this embodiment only one emitting device 715 is provided. The emission device 715 is gated by an OR gate 755 to all signal channels 765. Each of input channels 765 optionally include a gate or other active device 775 that is coupled to the OR gate 755. An enable signal 785 disables the timing signal because the output of the OR gate is forced high. When a test signal is provided to any of channels 765, the OR gate 755 enabled emitting device 715 and light is emitted and may be detected by the emission tester. In fact, since the OR gate 755 emits light when it switches output state, the OR gate itself can be used as the emitting device. As in the embodiment of FIG. 6, various collection optics and/or light detector may be encapsulated or integrated within this calibration DUT. Also, as can be appreciated, when using this calibration DUT, there's no need to move the collection optics at all. Rather, the collection optics is stationed to collect light from the single emission devices 715. Consequently, the stage can be eliminated so as to reduce the cost of the system.

In addition to measuring absolute and relative delay introduced by various elements of the tester, embodiments of the invention can also be used to investigate changes in the signal shape caused by the tester interface elements. One example is depicted in FIG. 7, wherein the calibration DUT includes a "channel gating" circuitry 775 that dictates when the incoming signal matches the characteristics needed to provide emission. That is, the photoemitter device 715 is capable of emitting light by receiving a signal of variety of characteristics, e.g., a wide range of voltages and/or currents. However, at any given time, the gating circuit 775 enables only signals of given characteristics, e.g., minimum voltage, to pass through. Consequently, the photoemitter 715 will only receive signals that were passed by the gating circuit.

To illustrate this concept more specifically, the reader is directed to FIG. 8, depicting an example of a system for reconstruction of the shape of the signal received by the DUT. For a more detailed explanation of this system the reader is directed to U.S. patent application Ser. No. 10/341,721 filed Jan. 13, 2003, which is assigned to the assignee and is incorporated herein in its entirety by reference. As shown in FIG. 8, tester 810 generates a test signal 802, which is provided to the DUT 805 and is applied to one input of comparator 875 within DUT 805. At the same time, the tester provides a slow clock signal 804 to counter 822 and signal 806 to the TRE system 890 (e.g., Emiscope™). The output of the counter 822 is converted to a voltage by the digital to analog converter 824. The D/A converter 824 provides a reference signal, e.g., reference potential, to the reference input of comparator 875. Only when the test signal 802 exceeds the reference potential, the comparator 875 switches output state and provides an output signal to the photoemitter 815. The photoemitter 815 then emits light, which is detected by detector 870. Detector 870 then provides a detection signal to the tester 890.

While it should be appreciated that any conventional comparator may be used in the embodiment described, one example of comparator is provided in Soumyanath, K., S. Borkae, et al., "Accurate On-Chip Interconnect Evaluation: A Time-Domain Technique" IEEE Journal of Solid-State Circuits 34(5) 623–631 (1999), which is incorporated herein by reference in its entirety. It should also be understood that the counter 822 and D/A converter 824 may or may not be integrated on the same microchip as the DUT 805.

An illustrative operation of the signal reconstruction according to an embodiment of the invention will be described with reference to FIGS. 8 and 9*a*–9*e*. FIG. 9*a* depicts a graph of the test signal 900 provided by the tester 810. The shape of test signal 900 can be characterized by its potentials Vi, Vii, and Viii, at times $t_1$, $t_2$, and $t_3$, respectively. In this example, D/A converter 824 provides three different reference potentials in response to consecutive voltage reference signals provided by counter 822. Thus, while not shown in FIG. 9*a*, in this example the tester actually provides three consecutive test signals 900. For each of these test signals, the D/A converter 824 provides a different reference signal to the comparator 875, so that the comparator 875 will provide an output signal corresponding to voltages Vi, Vii, and Viii, respectively. When the first test signal 900 is provided, the D/A converter 824 provides a reference potential corresponding to Vi to comparator 875, so that the tester can time when voltage Vi has been received by the DUT 805.

The first detection signal provided by detector 870 is exemplified by curve 901 in FIG. 9*b*. As can be seen, the timing of curve 901 is somewhat delayed as compared to signal 900. This measured delay, δ, can be used to calibrate the specific channel of the tester. As subsequent second and third signals 900 are provided by the tester, the reference potential provided by the D/A converter 824 is increased in correspondence with voltages Vii and Viii. The corresponding timing of emissions from photoemitter 815 are depicted in FIGS. 9*c* and 9*d*, and a reconstruction of the total signal is provided in FIG. 9*e*. As can be seen, due to the delay introduced by the various intervening elements of the tester, signal 900 generated by the tester has been modified or corrupted and its shape, as seen by the DUT 805, has been changed to signal 904 reconstructed in FIG. 9e. Thus, in addition to calibrating the tester for only a simple delay, this information can now be used to calibrate the tester for the entire shape of the signal.

Figure 10:
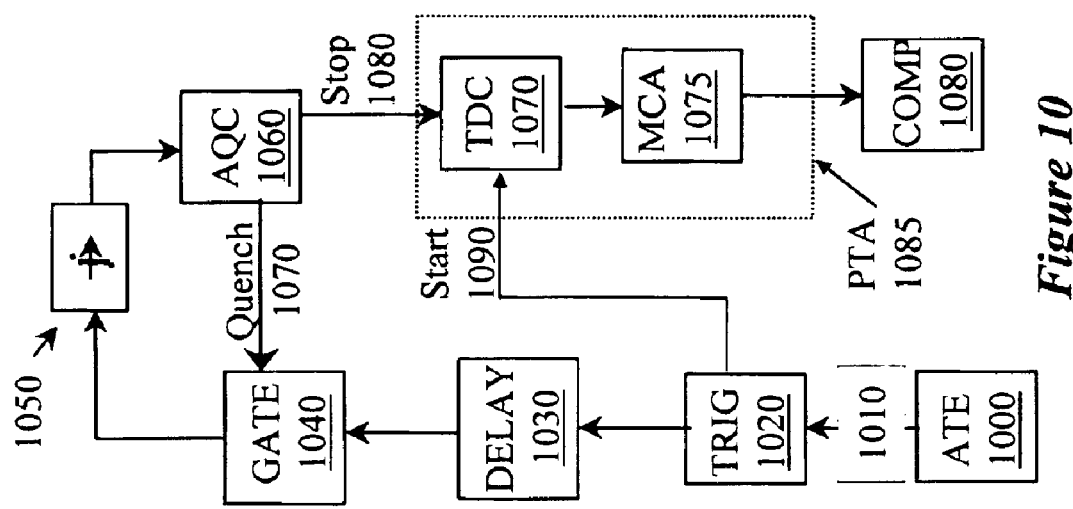
FIG. 10 depicts an embodiment of the photoemission detection system that may be used in various implementations of the present invention.

FIG. 10 exemplifies a high-speed time resolved emission detection scheme that may be used to detect the photoemission in any of the embodiments described above. Specifically, tester 1000 generates a trigger signal 1010, which is sent to a triggering circuit 1020. Triggering circuit 1020 enables triggering on either the rising or falling edge of the trigger signal 1010, with a selectable amplitude, e.g., in the range of −2.5 to +2.5 Volts. When the appropriate triggering conditions have been detected, triggering circuit 1020 generates a high-speed "START" signal 1090 which defines the beginning of an acquisition sequence. The triggering circuit 1020 also provides a signal to a delay generation circuit 1030, which waits a user-selectable amount of time before issuing a signal to gating circuitry 1040. Gating circuitry 1040 is used to gate detector 1050 on and off. The gating circuitry 1040 gates on detector 1050, at which point it can detect individual photons. Detector 1050 remains gated on according to a user-selectable period of time as determined by the delay generation circuitry 1030, but detector 1050 can be actively quenched, i.e. gated off, if acquisition circuitry (ACQ) 1060 determines that a photon has been detected by detector 1050. Specifically, AQC 1060 monitors detector 1050 for photon detection, and if a photon is detected AQC 1060 sends two signal; the first signal, Quench 1070, instructs the gating circuitry to gate off detector 1050, while the second signal is a high-speed "STOP" signal 1080 which defines the photon arrival time at the detector. Thus, if a photon is detected by detector 1050, the Quench signal 1070 will instruct the gating circuitry 1040 to gate off detector 1050 before the delay circuitry 1030 would otherwise have caused gating circuitry 1040 to gate off the detector 1050.

The "START" 1090 and "STOP" 1080 signals are used by the Picosecond Timing Analyzer (PTA) 1085, which is a commercial test instrument. PTA 1085 comprises a time-to-digital converter (TDC) 1070 and a multichannel analyzer (MCA) 1075, which forms a histogram of the photon event times during a data acquisition sequence. The histogram is transferred to the computer 1080 through the PTA 1085 electrical interface.

As can be understood by those skilled in the art, various elements of the invention have been described in simplified form, so as to make the explanation clear and concise while avoiding clutter. For example, while in the above description reference is made to photoemission or lack thereof, one can understand that the same effect can be obtained by referring to a probability of photoemission and repetition of the testing. Similarly, while various embodiments have been described with reference to voltage level, the invention is not so limited. Rather, the same effect can be gained for other signal characteristics, such as, for example, current, frequency, noise level, etc. In the same manner, references to photoemitter can be understood as any of semiconductor devices that emit light upon a change of state, such as, for example, saturated nMOS or pMOS transistors or CMOS devices.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference. The described invention provides at least the following advantages: fast and accurate calibration of timing and voltage level of pins, including calibration of tester load board and socket (while conventional calibration methods require removal of the load board and insertion of a special calibration fixture).

What is claimed is:

1. A method for calibration and verification of a semiconductor circuit tester, comprising:

programming the tester to generate a plurality of test signals using a plurality of channels;

providing the plurality of test signals to a device under test (DUT) via intermediate elements;

detecting time-resolved light emission from the DUT;

correlating timing of said time-resolved light emission to timing of said test signals, so as to obtain delay values caused by said intermediate elements; and performing calibration and/or verification of the tester using said delay values.

2. The method of claim 1, wherein said intermediate elements comprise at least one of a test head, a tester load board, and a DUT socket.

3. The method of claim 1, further comprising providing a feedback loop for feeding said delay values to said tester.

4. The method of claim 1, further comprising characterizing said DUT to obtain secondary delay values caused by internal elements of said DUT.

5. The method of claim 1, further comprising:

providing a gating mechanism coupled to photoemitting devices of said DUT;

for each test signal, setting a pre-specified gating characteristics for said gating mechanism;

obtaining a plurality of emission timing for a plurality of pre-specified gating characteristics; and using the plurality of emission timing to reconstruct said test signal.

6. The method of claim 5, wherein said gating mechanism comprises a comparator.

7. The method of claim 6, wherein said gating characteristics comprise voltage potential.

\* \* \* \* \*